United States Patent
Molyneaux et al.

(10) Patent No.: US 6,836,118 B2
(45) Date of Patent: Dec. 28, 2004

(54) METHOD AND APPARATUS FOR NMR IMAGING

(75) Inventors: David A. Molyneaux, Gainesville, FL (US); G. Randy Duensing, Gainesville, FL (US); S. Uli Gotshal, Gainesville, FL (US); Thomas E. Schubert, Delafield, WI (US); Alan Holland, Archer, FL (US); Scott B. King, Gainesville, FL (US)

(73) Assignee: MRI Devices Corp., Gainesville, FL (US)

( * ) Notice: Subject to any disclaimer, the term of this patent is extended or adjusted under 35 U.S.C. 154(b) by 0 days.

(21) Appl. No.: 09/522,808

(22) Filed: Mar. 10, 2000

(65) Prior Publication Data

US 2004/0212366 A1 Oct. 28, 2004

(51) Int. Cl.⁷ ............................. G01V 3/00; A61B 5/055
(52) U.S. Cl. ................... 324/319; 324/318; 324/303; 324/322; 600/422
(58) Field of Search ................. 324/307, 309, 324/318–322, 303, 306; 600/422, 421, 407

(56) References Cited

U.S. PATENT DOCUMENTS

| | | | |
|---|---|---|---|
| 4,093,910 A | 6/1978 | Hill | |
| 4,475,084 A | 10/1984 | Moore et al. | |
| 4,721,913 A | 1/1988 | Hyde et al. | 324/318 |
| 4,725,779 A | 2/1988 | Hyde et al. | 324/318 |
| 4,766,383 A | 8/1988 | Fox et al. | |
| 4,825,162 A | 4/1989 | Roemer et al. | 324/318 |
| 4,866,387 A | 9/1989 | Hyde et al. | 324/318 |
| 4,918,388 A * | 4/1990 | Mehizadeh et al. | 324/322 |
| 5,041,791 A | 8/1991 | Ackerman et al. | |
| 5,185,577 A | 2/1993 | Minemura | 324/318 |
| 5,258,717 A | 11/1993 | Misic et al. | 324/318 |
| 5,311,135 A * | 5/1994 | Vavrek et al. | 324/318 |
| 5,351,688 A | 10/1994 | Jones | 600/422 |
| 5,394,087 A * | 2/1995 | Molyneaux | 324/318 |
| 5,594,337 A * | 1/1997 | Boskamp | 324/318 |
| 5,650,724 A | 7/1997 | Yamagata | |
| 5,680,044 A * | 10/1997 | McDougall et al. | 324/303 |
| 5,951,474 A | 9/1999 | Matsunaga et al. | 600/422 |
| 6,118,272 A * | 9/2000 | Taicher et al. | 324/303 |
| 6,285,188 B1 * | 9/2001 | Sakakura | 324/318 |
| 6,493,572 B1 * | 12/2002 | Su et al. | 600/422 |
| 6,701,177 B2 * | 3/2004 | Su | 600/422 |
| 6,701,178 B2 * | 3/2004 | Su et al. | 600/422 |

(List continued on next page.)

FOREIGN PATENT DOCUMENTS

| | | |
|---|---|---|
| EP | 0 133 382 A1 | 2/1985 |
| EP | 0 430 103 A2 | 6/1991 |
| EP | 0 529 730 A1 | 3/1993 |
| EP | 0 758 751 A1 | 2/1997 |

OTHER PUBLICATIONS

Alderman, D. et al., "An Efficient Decoupler Coil Design which Reduces Heating in Conductive Samples in Superconducting Spectrometers," *Journal Of Magnetic Resonance*, 1979, pp. 447–451, vol. 36, Academic Press, London, GB.

(List continued on next page.)

Primary Examiner—Diego Gutierrez
Assistant Examiner—Tiffany A. Fetzner
(74) Attorney, Agent, or Firm—Saliwanchik, Lloyd & Saliwanchik

(57) ABSTRACT

The subject invention pertains to a method and apparatus for Nuclear Magnetic Resonance (NMR) imaging. The subject method and apparatus are advantageous with respect to the use of RF coils for receiving signals in NMR scanners. The subject invention can utilize multiple coils to, for example, improve the signal to noise, increase the coverage area, and/or reduce the acquisition time. The use of multiple smaller surface or volume coils to receive NMR signals from the sample can increase the signal to noise ratio compared to a larger coil that has the same field of view and coverage area.

59 Claims, 11 Drawing Sheets

U.S. PATENT DOCUMENTS

| | | | |
|---|---|---|---|
| 6,751,496 B2 * | 6/2004 | Su et al. | 600/422 |
| 6,768,303 B1 * | 7/2004 | Su et al. | 324/309 |
| 2002/0013526 A1 | 1/2002 | Su et al. | |
| 2003/0109782 A1 * | 6/2003 | Su et al. | 600/421 |
| 2003/0114748 A1 * | 6/2003 | Su et al. | 600/422 |

OTHER PUBLICATIONS

Chen, Wei et al., "The Antisense Coaxial Surface–Coil Probe, an Improved Method for Coil–to–Coil Electromagnetic Decoupling of Coaxial Surface Coils," *Journal of Magnetic Resonance*, Jun. 1992, pp. 238–258, vol. 98, Academic Press, Orlando, U.S..

Duensing, Randy G et al., "A 4–Channel Volume Coil for Vertical Field MRI," *Proceedings of the International Society For Magnetic Resonance in Medicine, Eighth Scientific Meeting and Exhibition*, Apr. 2000, p. 1398, vol. 2, Denver, USA.

King, Scott B. et al., "MR Spectroscopy Using Multi–Ring Surface Coils," *Magnetic Resonance in Medicine*, Oct. 1999, pp. 655–664, vol. 42, No. 4.

King, Scott B. et al., "Intrinsic RF Coil Isolation in a Gradient B1–Field," *Proceedings Of The International Society For Magnetic Resonance In Medicine, Eighth Scientific Meeting And Exhibition*, Apr. 2000, p. 1404, vol. 2, Denver USA.

Nicholson, I. et al., "Recent Developments in Combining LODESR Imaging with Proton NMR Imaging," *Physics In Medicine And Biology*, Jul. 1998, vol. 43, No. 7, Taylor and Francis Ltd., London, GB.

Grover, Frederick W. "Mutual Inductance of Circular Elements with Parallel Axes" *Inductance Calculations: Working Formulas and Tables*. Ch. 18, pp 177–179, Dover Publications, Inc. New York.

* cited by examiner

METHOD AND APPARATUS FOR NMR IMAGING

BACKGROUND OF THE INVENTION

The subject invention relates to the field of Nuclear Magnetic Resonance (NMR) imaging. The subject method and apparatus can allow an improved signal to noise ratio and is particularly advantageous for application to vertical field NMR imaging.

There are numerous examples of surface and volume coils described in the literature and available as commercial products. Several of these examples utilize multiple coils for an increased signal to noise ratio over a given field of view. In most cases, multiple coils examples have been applied to coil systems for use in a horizontal magnetic fields. Furthermore, the multiple coils are typically positioned to have no, or minimal, interaction with neighboring coils.

In order to image a large field of view, a first coil can be placed at one position, and one or more additional coils can be placed next to the first coil. If the coils interact with each other, it is preferable to switch the coils on and off such that only one coil is on at a time. Such a coil system can be referred to as a switchable coil. If the coils are positioned relative to one another such that they have minimal, or no, interaction, the coils can be switched on simultaneously allowing the entire field of view to be imaged at once. Such a coil system can be referred to as a phased array coil. The resultant image can have the signal to noise ratio of a small coil and the field of view of a large coil.

Advances in phased array coils have allowed linear coils to be positioned next to other linear coils, quadrature coils to be positioned next to other quadrature coils, and volume coils to be positioned next to other volume coils. In most cases, these coils have minimal mutual inductance and/or utilize some cancellation networks to reduce coupling. This concept can be applied to cover a larger area with several smaller coils.

U.S. Pat. No. 4,825,162 (Roemer et al.) discloses the use of multiple noninteracting coils to acquire an NMR image. In U.S. Pat. No. 4,825,162, the disclosed coils utilize simple linear designs that are intended to be used in a horizontal magnet system. These designs have no or minimal mutual inductance between the various coils, due to the relative position and/or the use of additional decoupling circuitry. However, while the goal of the Roemer device is to extend the field of view while preserving the signal to noise, the device finds limited application because two or more linear coils cannot be positioned to see the same field of view while preserving the signal to noise ratio. Also, since the minimization of mutual inductance is the first criteria for isolation, secondary methods are then used to improve the isolation further.

U.S. Pat. No. 5,394,087 (Molyneaux) discloses the use of quadrature coils positioned to minimize interaction between coils in order to achieve a higher signal to noise ratio than linear coils, while achieving a larger field of view compared to a single quadrature coil in horizontal field configurations. In U.S. Pat. No. 5,951,474 (Matsunaga et al.), the use of similar geometries to those disclosed in U.S. Pat. No. 5,951,474 is described for vertical field configurations. U.S. Pat. No. 5,258,717 discloses volume coils overlapped in the direction of the main field to extend the field of view, while preserving the signal to noise of a single volume coil for horizontal configurations. A major disadvantage of the configuration disclosed in the Molyneaux patent, the Matsunaga, et al. patent, and the Misic, et al. patent is the inability to use two or more linear coils positioned to see the same field of view while preserving the signal to noise where only one quadrature coil sees the same field of view. Also, the configurations disclosed in the Molyneaux and Misic et al. patents are designed to work primarily with horizontal fields. Although the Matsunaga et al. device is intended for use in vertical fields, considerable coupling can occur between adjacent quadrature coils, negatively impacting the signal to noise ratio.

U.S. Pat. No. 4,766,383 (Fox et al.) and U.S. Pat. No. 5,185,577 (Minemura) describe configurations utilizing crossed ellipse coils, such that two ellipsical coils are positioned to be orthogonal to one another for quadrature detection. The output is then sent to a quadrature combiner. A major disadvantage of the configurations disclosed in the Fox et al. and Minemura patents is that the crossed ellipse coils are used as quadrature coils, not array coils, and can substantially increase the signal to noise as compared to a solenoid.

U.S. Pat. No. 5,351,688 (Jones) describes the use of solenoids in a quadrature fashion, where one solenoid is used for the first direction of quadrature detection and a pair of solenoids are hooked together to make a Helmholtz pair in the second direction. Again, the output is sent to a quadrature combine. The major disadvantage of the configuration in the Jones patent is that the solenoid is used with a set of solenoids that are configured as a Helmholtz pair and then fed into a quadrature combine. This results in no increased field of view and no significant increase in signal to noise due to the addition of the Helmholtz coils, as the center of the Helmholtz coils is far away from the center of the single solenoid and the field sensitivity drops as the square of the distance away from the center of the loop.

U.S. Pat. No. 4,725,779 (Hyde, et al.) and U.S. Pat. No. 4,721,913 (Hyde, et al.) disclose the use of a single or multiple loop gap resonators forming linear coils. The loop gap resonators consist of opposite rotating current coils and planar pair coils. A significant disadvantage of the apparatus disclosed in U.S. Pat. Nos. 4,725,779 and 4,721,913 is the use of a single linear coil (either opposite rotating or planar pair) with reduced sensitivity over a solenoid coil. U.S. Pat. No. 4,866,387 (Hyde, et al.) discloses an opposite rotating current loop gap resonator and a planar pair which are combined to form a quadrature coil. U.S. Pat. No. 4,866,387 also discloses a plurality of planar pair and opposite rotating coils which are positioned adjacent to one another to form a network of coils. A drawback with respect to the configuration disclosed in U.S. Pat. No. 4,866,387 is the use of orthogonality for the isolation of overlapping and adjacent structures.

BRIEF SUMMARY OF THE INVENTION

The subject invention pertains to a method and apparatus for Nuclear Magnetic Resonance (NMR) imaging. The subject method and apparatus are particularly advantageous with respect to the use of RF coils for receiving signals in NMR scanners. In a specific embodiment, the subject method and apparatus can utilize multiple coils to, for example, improve the signal to noise, increase the coverage area, and/or reduce the acquisition time. The use of multiple smaller surface or volume coils to receive NMR signals from the sample can increase the signal to noise ratio compared to a larger coil that has the same field of view and coverage area.

DETAILED DESCRIPTION OF THE INVENTION

Figure 1:
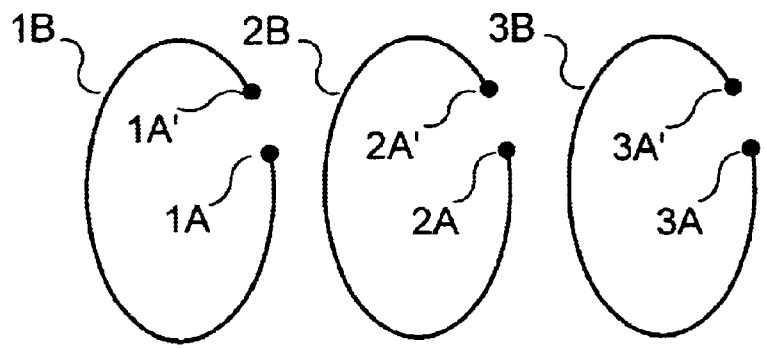
FIG. 1 illustrates an embodiment of the subject invention utilizing three single loops.

The subject invention relates to a method and apparatus for Nuclear Magnetic Resonance (NMR) imaging. The subject method and apparatus can take advantage of the properties of a system utilizing a solenoid located at or near essentially zero magnetic field planes of other solenoid configurations, and are particularly advantageous with respect to the use of RF coils for receiving signals in NMR scanners. The use of multiple smaller surface or volume coils to receive NMR signals from the sample can increase the signal to noise ratio compared to a larger coil that has the same field of view and coverage area. Accordingly, the subject method and apparatus can utilize multiple coils to, for example, improve the signal to noise, increase the coverage area, and/or reduce the acquisition time.

In the subject application, for ease of description, the coil configurations are often described in relation to the fields they would create if driven as generating coils. It is understood that this description, due to reciprocity between generating fields and receiving fields with a coil configuration, can also be descriptive of coil configurations for receiving magnetic fields. It is understood that a coil configuration associated with a magnetic field can be used for generating such magnetic field, detecting such magnetic field, or generating and detecting such magnetic field. In order to generate and receive, a coil configuration can, for example, be driven by a means for utilizing the coils for generating magnetic fields and then, after discontinuing the generation of the fields, a means for utilizing the coils for detecting can be employed for detecting magnetic fields associated with the coils. Accordingly, a zero-flux plane with respect to coil configuration designed for producing magnetic fields can be a plane in which any magnetic field would not be detected by the same coil configuration when used for receiving, or detecting, magnetic fields.

In a specific embodiment of the subject invention, three coils are positioned in a configuration such that two outer coils are coaxial, lie in parallel planes, and are driven by currents of opposite direction. In this three coil configuration, the center coil lies in a plane parallel to the planes of the outer two coils and is located near an essentially zero magnetic flux plane produced by the outer coils. If the outer coils have essentially identical shape and size, and the currents in the outer coils are approximately equal, such zero magnetic flux plane will be approximately at the midpoint between the planes of the two outer coils. The position of this zero-flux plane with respect to the relative distance to each outer coil can be adjusted by changing the ratio of the magnitudes of the currents in the outer two coils. The shape of the zero-flux plane may change to some more complicated zero-flux contour as well.

Although the parallel, coaxial orientation of the outer coils is preferred, other configurations are also possible. For example, the two outer coils can be non-coaxial, but still lie in parallel planes. This embodiment can be useful for imaging, for example, a person's head when the head leans forward. In this case, the zero-flux contour may not be a plane, but a more complicated geometry. In another embodiment, the two outer coils are non-coaxial and do not lie in parallel planes. This embodiment can be useful for imaging, for example, a person's shoulder, where the non-parallel coils can better conformn to the shape of the shoulder. In addition, although loops of the approximate same size are preferred, different sized loops can also be used together.

FIG. 1 shows a preferred embodiment employing three parallel loops, 1B, 2B, and 3B, of the same size and shape. In this embodiment, loops 1B and 3B are approximately equidistant from the central loop 2B and designed such that approximately equal currents can flow through them in opposite directions. The central loop, 2B, can be considered a first channel and the other two loops 1B and 3B can be considered a second channel. Although the subject invention can be utilized even when significant coupling between the two channels exists, preferably the coils are designed such that the coupling between the two channels is extremely low. Isolation circuitry can optionally be incorporated to reduce coupling. Advantageously, this design employing a single loop as a first channel and a pair of loops as a second channel can result in the pair of loops producing approximately zero magnetic flux in the plane of the single loop.

Figure 2:
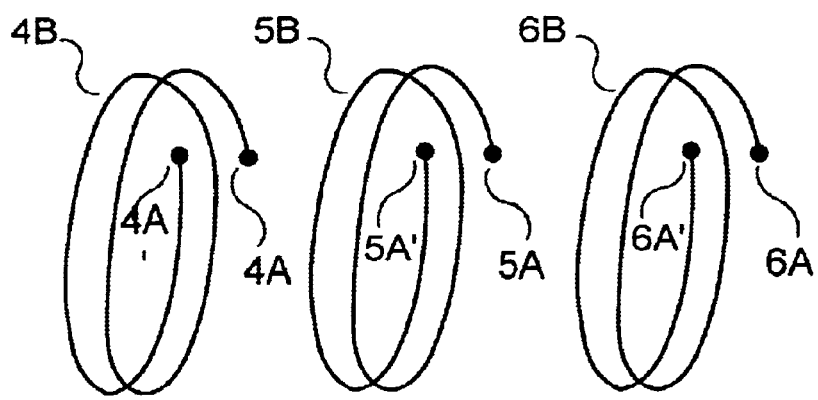
FIG. 2 illustrates an embodiment of the subject invention utilizing three series loops.
Figure 3:
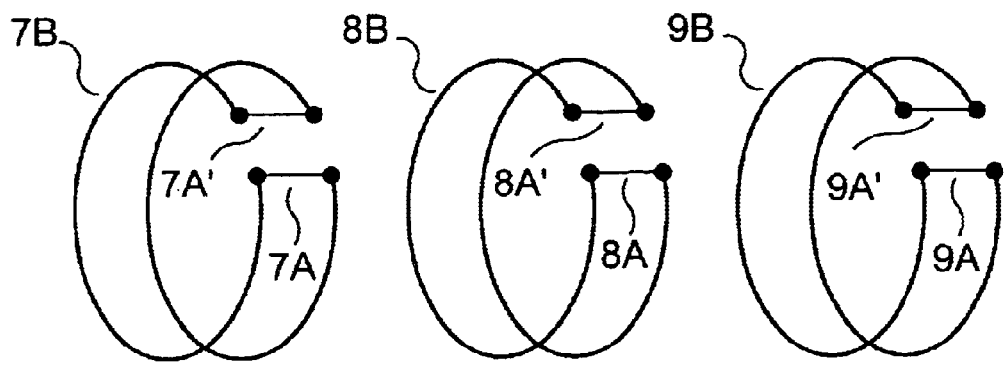
FIG. 3 illustrates an embodiment of the subject invention utilizing three parallel loops.

Connections can be made between loops 1B and 3B such that the loops have currents flowing in opposite directions. These connections can be, for example, series or parallel connections. Although, the solenoids shown in FIG. 1 are single turns, or loops, the solenoids can be multiturn solenoids and can be wound as series loops or parallel loops. FIG. 2 shows an embodiment utilizing series loops and FIG. 3 shows an embodiment utilizing parallel loops. Referring to FIGS. 2 and 3, the connections between 4A and 6A, as well as 7A and 9A, may be series or parallel as long as the currents are flowing in opposite directions in the two loops.

Figure 4:
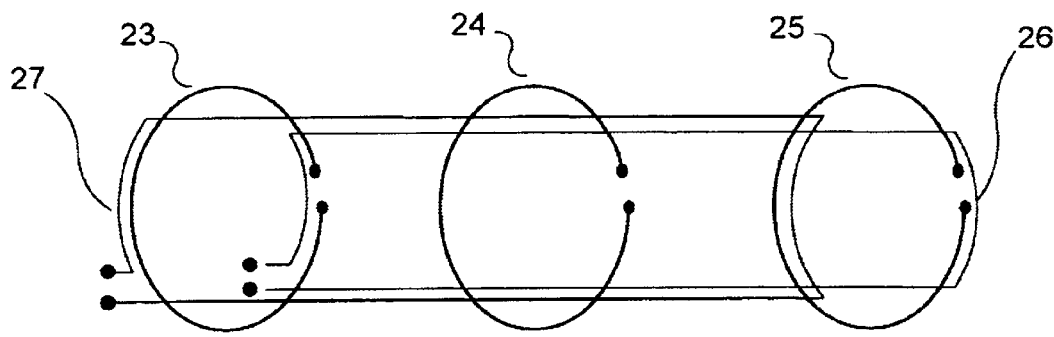
FIG. 4 illustrates an embodiment of the subject invention utilizing three loops and a Helmholtz pair of large loops.
Figure 5:
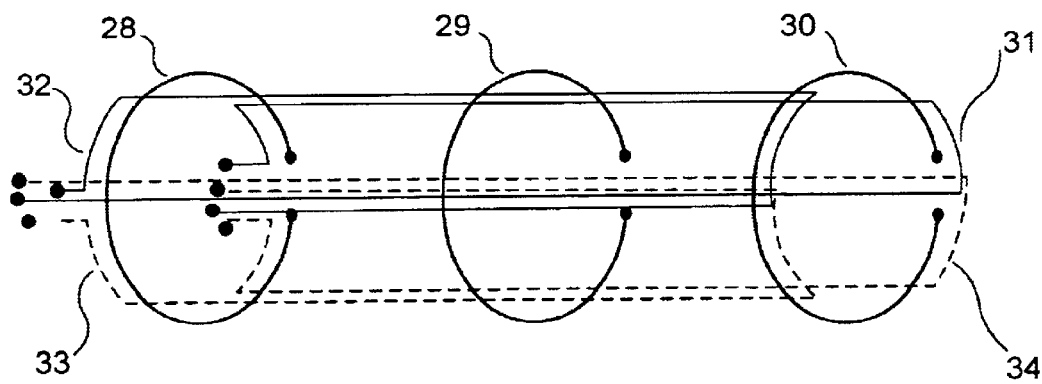
FIG. 5. illustrates an embodiment of the subject invention utilizing three loops, a Helmholtz pair top loops, and a Helmholtz pair bottom loops.
Figure 6:
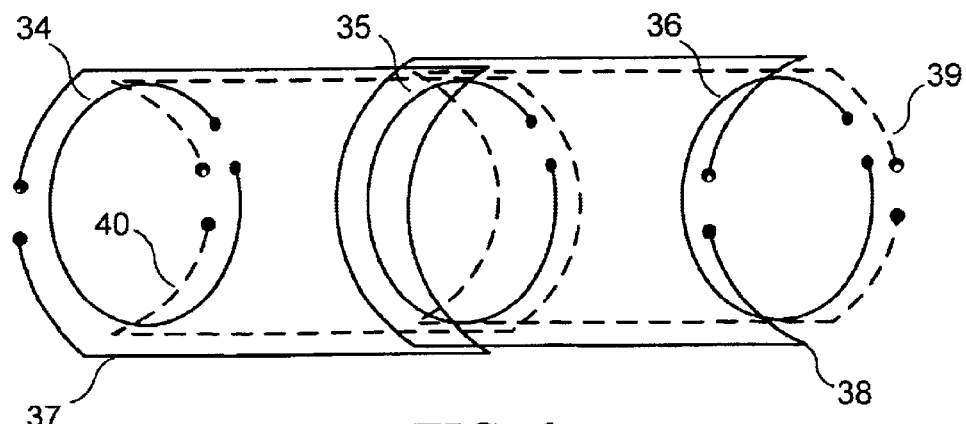
FIG. 6 illustrates an embodiment of the subject invention utilizing three loops and two Helmholtz pairs side-by-side loops.

The method and apparatus of the subject invention can also incorporate at least one Helmholtz pair which generates a magnetic field orthogonal to the fields produced by the solenoids of FIG. 1. FIGS. 4, 5, and 6 illustrate a few examples where Helmholtz pairs are added to the embodiment of FIG. 1. Although FIGS. 4, 5 and 6 illustrate the incorporation of these Helmholtz coils with a three coil embodiment, these Helmholtz coils can be incorporated with other embodiments of the subject invention as well, for example embodiment having additional coils, additional channels, different coil orientations, and/or different size coils. Once again, even though the loops in FIGS. 4, 5, and 6 are shown as single turns, or loops, the loops that make up a Helmholtz pair can also be multiturn solenoids and can be wound as series loops or parallel loops. Also, the connections between 26 and 27, 31 and 32, 33 and 34, 37 and 40, and 38 and 39 can be series or parallel and allow approximately equal currents to flow in the two loops of the pair.

FIG. 4 shows an embodiment incorporating a "large loops" Helmholtz coil pair. Although the preferred embodiment of the large loops Helmholtz pair is shown, where the large static magnetic field used during NMR is oriented from bottom to top of the Figure, this pair can be rotated about the central axis of the cylinder formed by loops 23, 24 and 25. Also an additional large loop Helmholtz coil pair can be utilized if desired. For example, an additional large loop Helmholtz coil pair can be added to the top and bottom of the embodiment shown in FIG. 4 such that essentially the entire cylinder formed by loops 23, 24, and 25 is surrounded by the two large loop Helmholtz coil pairs.

FIG. 5 shows an embodiment which incorporates top/bottom loops. In this embodiment coil 31 and coil 32 form a top coil pair and coil 33 and coil 34 form a bottom coil pair. Preferably, the coil pairs overlap such that mutual inductance between coil 32 and coil 33 and between coil 31 and coil 34 is low. Most preferably, the amount of overlap can be selected so as to achieve approximately zero mutual inductance. Additional coil pairs can be added and/or the coil pair(s) can be rotated with respect to the central axis of the cylinder formed by loops 28, 29, and 30.

FIG. 6 shows an embodiment of the subject invention incorporating side by side loops. Loops 37 and 40 form one loop pair and loops 38 and 39 form another. Preferably the amount of overlap of side by side loop pairs is chosen so that the mutual inductance of the loops is low, and, more preferably, the amount of overlap is chosen so that the mutual inductance is approximately zero. Additional loops can be added to one or more side by side pairs and/or additional side by side pairs can be added. Again, the side by side pairs can be rotated with respect to the central axis of the cylinder formed by loops 34, 35, and 36.

Figure 7:
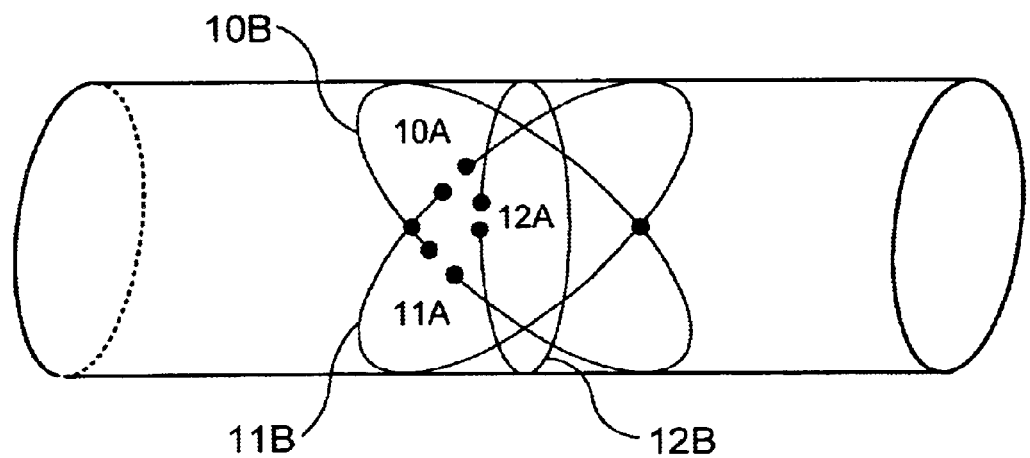
FIG. 7 illustrates an embodiment of the subject invention utilizing crossed ellipse loops and an independent loop.
Figure 8:
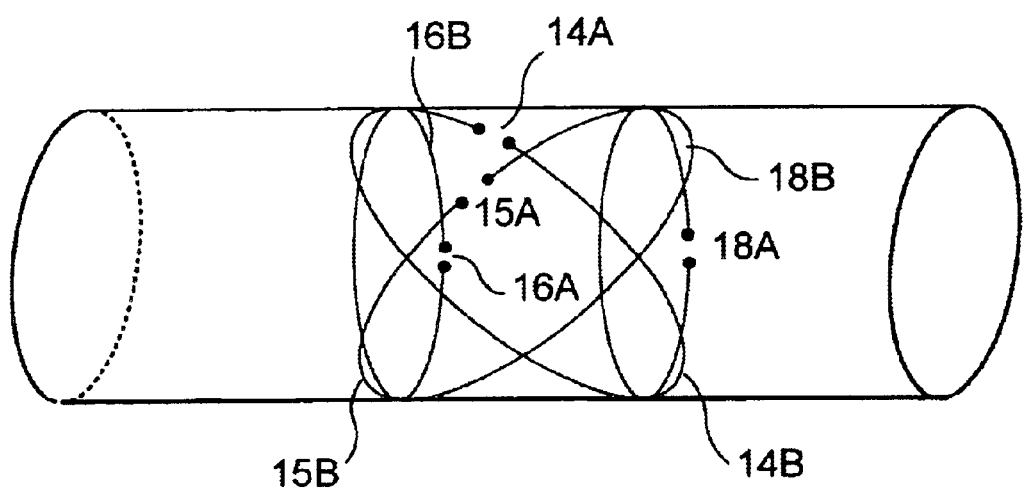
FIG. 8 illustrates an embodiment of the subject invention utilizing crossed ellipse loops and a pair of opposite current loops.
Figure 9A:
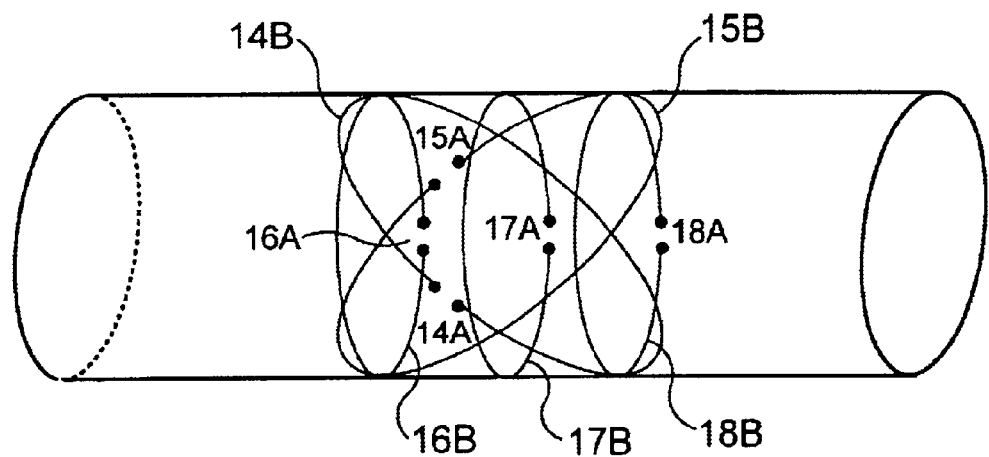
FIG. 9A illustrates an embodiment of the subject invention utilizing crossed ellipse loops and three loops.

Another embodiment of the subject invention incorporates a crossed ellipse geometry with the three solenoid model shown in FIG. 1, an example of which is shown in FIG. 9A. The single solenoid can be removed if desired and the opposite current solenoids can be utilized with the crossed ellipse, as shown in FIG. 8. Alternatively, the opposite current solenoids can be removed and the independent solenoid can be utilized with the crossed ellipse, as shown in FIG. 7. For ease of illustration, the crossed ellipses have been drawn such that their "intersection" is not at the top and bottom of the cylinder. Preferably, the intersection of the crossed ellipses (note the ellipses do not necessarily come into electrical contact at this intersection) is at the top and bottom of FIGS. 7, 8 and 9A, where the large external static magnetic field is oriented from the bottom to the top of the Figures. Most preferably, the intersection of the crossed ellipses is at the single loop, if present.

Figure 12:
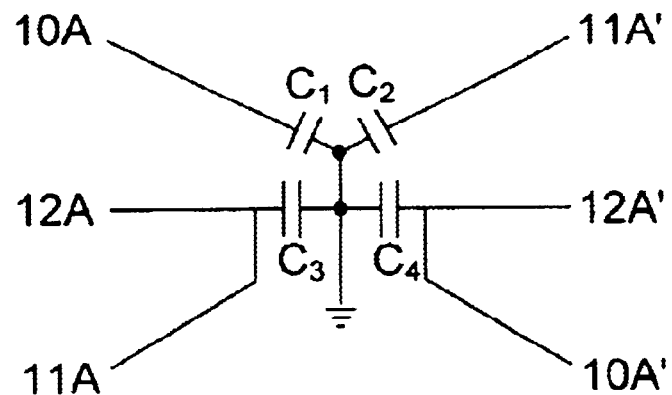
FIG. 12 illustrates a capacitive network which can be used to cancel mutual inductance between a single loop and crossed ellipse loops.

With respect to the embodiments shown in FIG. 7 and FIG. 9A, FIG. 12 illustrates a specific embodiment of a capacitive network which can be used to minimize or cancel mutual inductance between the single solenoid and the crossed ellipse. Referring to FIGS. 12, 10A and 10A' represent the contacts for ellipse 10B and are analogous to contacts 14A and 14A' for ellipse 14B of FIG. 9A; 12A and 12A' represent the contacts for loop 12B and are analogous to contacts 17A and 17A' for loop 17B of FIGS. 9A; and 11A and 11A' represent the contacts for ellipse 11B and are analogous to contacts 15A and 15A' for ellipse 15B of FIGS. 9A. C1, C2, C3, and C4 are four capacitive elements of the capacitive network shown in FIG. 12.

Figure 15A:
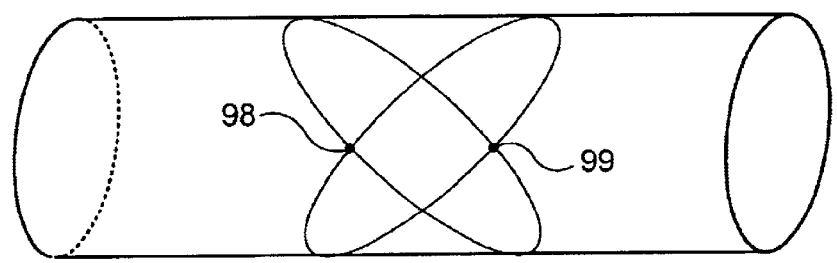
FIG. 15A illustrates an embodiment of the subject invention utilizing crossed ellipse loops.
Figure 15B:
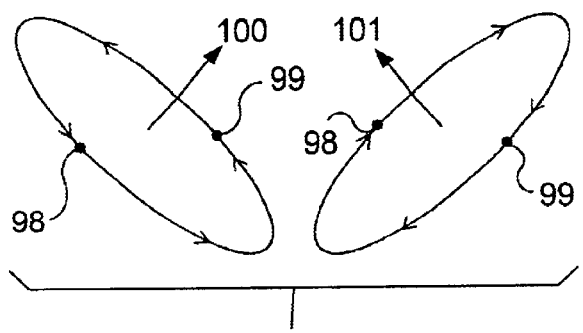
FIG. 15B illustrates a co-rotating current crossed ellipse configuration, in accordance with the subject invention.
Figure 15C:
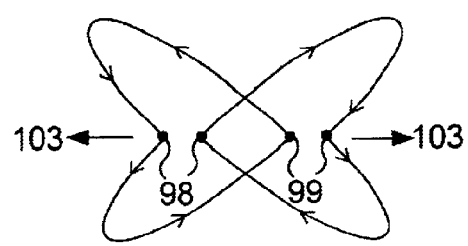
FIG. 15C illustrate an opposite current crossed ellipse configuration, in accordance with the subject invention.

In a specific embodiment, the crossed ellipse/opposite rotating configuration shown in FIG. 8 can be simplified by the superposition of the opposite rotating mode on the crossed ellipse conductors as shown in FIG. 15. In a specific embodiment, the two loops that form the opposite rotating mode in FIG. 8 can be removed, and the opposite rotating mode can be superimposed onto the crossed ellipse. In this embodiment, the crossed ellipse configuration can support two linear orthogonal modes, one for each loop, and a third mode which represents the opposite rotating mode. Alternatively, the crossed ellipse configuration can support two linear orthogonal modes, each a superposition of individual modes associated with each of the two coils. The opposite rotating mode can be isolated from the two linear orthogonal modes due to zero mutual inductance. Referring to FIGS. 8, 15B, and 15C, loop 15B can produce a first linear mode 100 of the crossed ellipse, and loop 14B can produce a second linear mode 101 of the crossed ellipse which is orthogonal to the first mode. The opposite rotating mode 103 of the crossed ellipse is shown in FIG. 15C where the crossed ellipses have been broken apart in a manner to emphasize the currents for producing the opposite rotating mode 103. Reference points 98 and 99 shown on FIGS. 15A, 15B, and 15C illustrate points at which the current can change directions to produce two linear orthogonal modes or the opposite rotating mode. Coupling to the structure can be achieved through capacitive or inductive methods. If desired, the opposite rotating mode can be produced on a second crossed ellipse coil pair aligned with the first coil pair.

Referring to the embodiment of the subject invention shown in FIG. 9A, coil 17B can act as a solenoid around the center of the region of interest. Coils 14B and 15B can form crossed ellipse coils, and coils 16B and 18B can form an opposite rotating coil centered on coil 17B. The opposite rotating coil can be isolated via symmetry from coils 17B, 14B, and 15B. 14A, 15A, 16A, 17A, and 18A show the contacts for the various coils. Coils 14B and 15B can be isolated from one another by, for example, having their axes perpendicular to each other. In this arrangement, Coil 17B can have strong mutual inductance with both coils 14B and 15B. This inductance can be isolated by using one or more of various techniques known to those skilled in the art. The opposite rotating coil can have a zero flux in the center and improve the homogeneneity of the coverage by producing fields away from the center. Advantageously, the embodiment of FIG. 9A can produce excellent homogeneity down the axis of the cylinder.

Figure 9B:
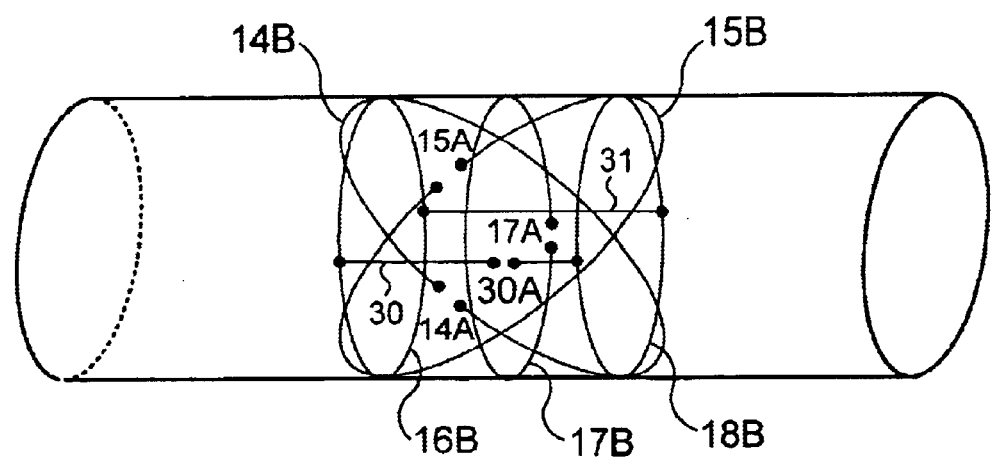
FIG. 9B illustrates an embodiment of the subject invention utilizing crossed ellipse loops, a center loop, and an Alderman-Grant loop.

In another embodiment of the subject invention, as shown in FIG. 9B, coil pair 16B and 18B can be modified so as to produce an Alderman-Grant (Alderman, D. W. and Grant, D. M., *Jo. Magnetic Resonance* 36:447 [1979]) type of coil, such that coil 17B is isolated from the Alderman-Grant coil due to the fields of the Alderman-Grant being perpendicular to the fields of coil 17B. Such an Alderman-Grant coil can be achieved by adding a pair of conductors 30 and 31 to connect coils 16B and 18B such that conductors 30 and 31 carry the same magnitude current in opposite directions. The currents flowing in conductors 30 and 31 are split when the currents enter a coil, with one-half the magnitude of the current flowing in each half of the coil. For example, current flowing from conductor 30 flows one-half in each half of coil 18B to conductor 31, and current flowing from conductor 31 flows one-half in each half of coil 16B to conductor 30. 14A, 15A, and 17A show the contacts for the various coils, and 30A shows the contacts for the Alderman-Grant coil. In this embodiment, coils 17B and the Alderman-Grant coil are isolated due to their perpendicular fields and coils 14B and 15B are isolated from one another by, for example, having their axes perpendicular to each other. Coil 17B shares inductance and sample resistance with coils 14B and 15B, and the Alderman-Grant coil shares inductance and resistance with coil 14B and 15B.

With respect to the embodiment shown in FIG. 9A, shared resistance between coils 17B and 14B and between coils 17B and 15B can limit the isolation. Preamplifier decoupling can increase the isolation to acceptable values. Also, due to the shared resistance, the amount of noise correlation in these channels is a consideration which should be taken into account.

Figure 10:
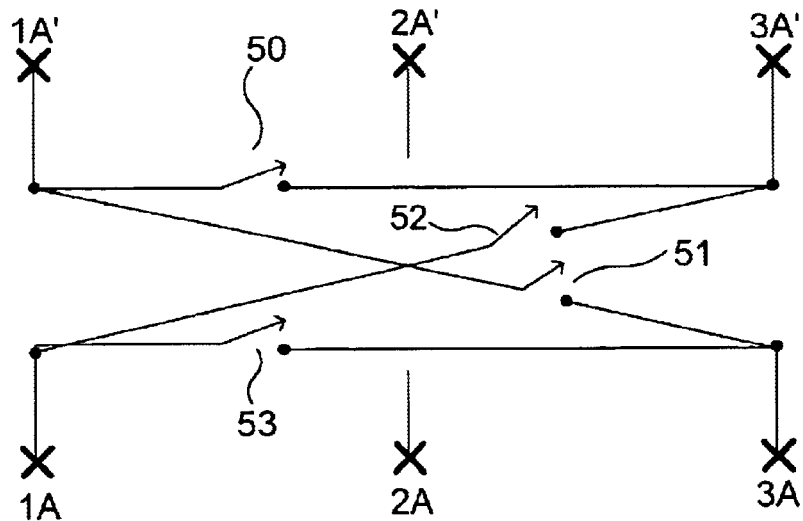
FIG. 10 illustrates an embodiment of a switching network for use with a three loop embodiment of the subject invention.
Figure 11:
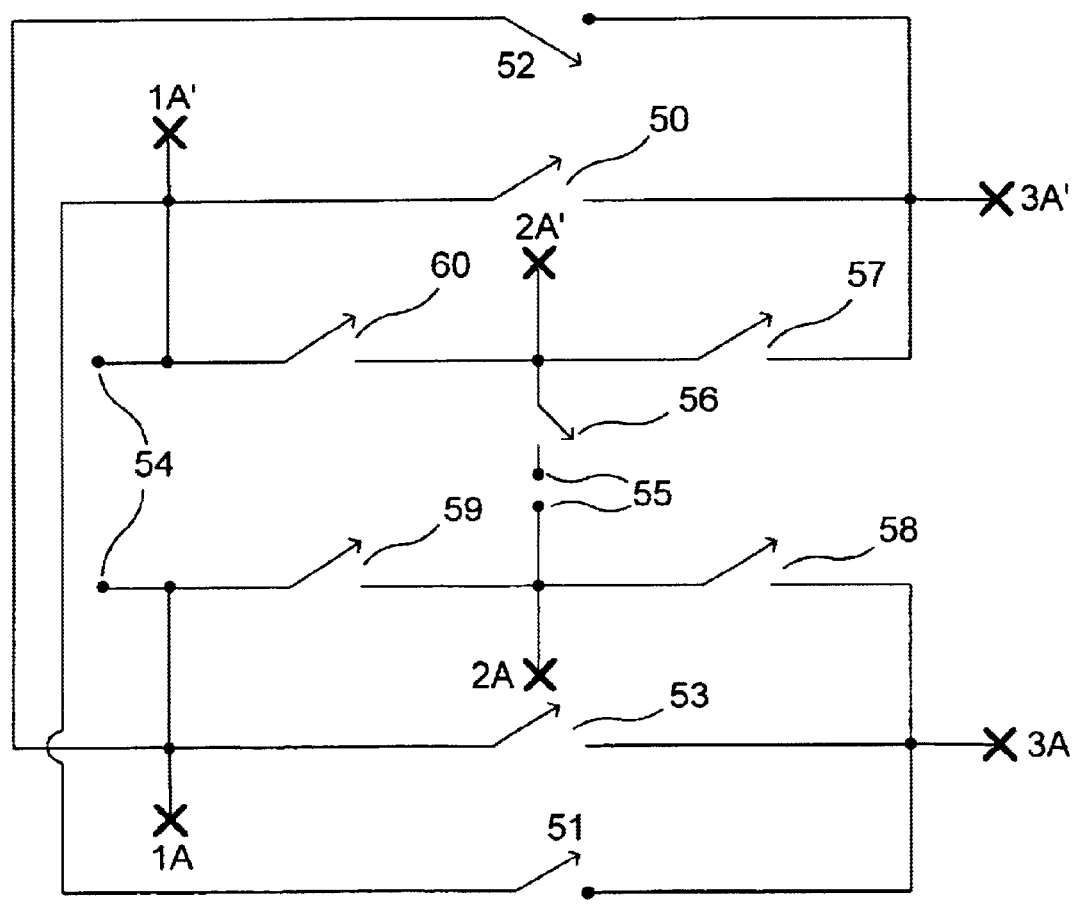
FIG. 11 illustrates another embodiment of a switching network for use with a three loop embodiment of the subject invention.

FIGS. 10 and 11 illustrate switching networks which can be utilized with respect to the three solenoid embodiment, for implementing a method to allow the opposite rotation of the loop currents in either a series or parallel fashion. FIG. 10 shows a switching network for allowing the outer two coils to have currents which either rotate in the same direction or in opposite directions. Referring to FIGS. 10, 1A', 2A', and 3A' connect to the top contacts of loops 1B, 2B, and 3B of FIG. 1, while 1A, 2A, and 3A connect to the bottom contacts. By closing switches 50 and 53, loops 1B and 3B can be driven in the same rotation direction. By closing switches 51 and 52 and opening switches 50 and 53, loops 1B and 3B can be driven in opposite rotation direction. Analogously, 1A', 2A', and 3A. of FIG. 11 can connect to the top contacts of loops 4B, 5B, and 6B (4A', 5A', and 6A', respectively) of FIG. 2, while 1A, 2A, and 3A of FIG. 11 connect to the bottom contacts (4A, 5A, and 6A, respectively). Analogously, 1A', 2A', and 3A' of FIG. 11 can connect to the top contacts of loops 7B, 8B, and 9B (7A', 8A', and 9A', respectively) of FIG. 3, while 1A, 2A, and 3A, of FIG. 11 connect to the bottom contacts (7A, 8A, and 9A, respectively).

FIG. 11 illustrates a more generalized switching network which can allow all three coils to have currents rotating in the same direction, or allow the center coil to operate independently, while the two outer coil currents either rotate in the same direction or rotate in opposite directions. Referring to FIGS. 11, 1A', 2A', and 3A' connect to the top contacts of loops 1B, 2B, and 3B of FIG. 1, while 1A, 2A, and 3A connect to the bottom contacts. The network is driven at lead pairs 54 and 55. If switches 50 and 53 are closed, loops 1B and 3B are driven in the same rotation direction with the center coil independent. By closing switch 56, loop 2B can be driven at lead pairs 55. By closing switches 60, 57, 56, 59, and 58, with switches 50 and 53 open, all three loops 1B, 2B and 3B can be driven in the same direction rotation so as to function as a three turn solenoid. By closing switches 51 and 52 and opening switches 50 and 53, loops 1B and 3B can be driven in opposite rotation direction. The network can also allow the three loops to operate as one loop for multiturn solenoid operation. The switching networks shown in FIGS. 10 and 11 can be modified to incorporate additional loops and/or channels as appropriate.

The method and apparatus of the subject invention can also be extended to more than two channels. With respect to the three solenoid example shown in FIG. 1, the single loop coil can function as a first channel having even symmetry, while the two outer loop coils can function as a second channel having odd symmetry. In alternative embodiments, the single loop coil can be replaced by one of a variety of loop configurations having multiple loops which maintain even symmetry and, accordingly, preserve the isolation of the channels. For example, a configuration having multiple loops can be utilized such that loop pairs carrying equal currents are placed equidistant from the plane defining even and odd symmetry. For non-equal currents, the distance each loop is from the center plane can be adjusted such that the even symmetry is maintained.

Furthermore, additional loop configurations with even symmetry can be added to create additional channels. These even modes can have an even number (including zero) nodes, or zero flux contours. In a specific embodiment, a third channel, having even symmetry and two nodes can be incorporated. Such a third channel can be configured such that the two nodes are positioned in the magnetic field such that the net current induced in the first channel, of even symmetry, is approximately zero when the third channel is driven. Advantageously, both even symmetry channels can remain isolated from the odd symmetry channel. Further embodiments of the subject invention can add additional even symmetry channels having a different number of nodes in an analogous manner where each even symmetry channel having a different number of nodes can be orthogonal to each of the other even symmetry channels.

Likewise, additional loop configurations with odd symmetry can be added to create additional channels. These odd modes can have an odd number of nodes, or zero flux contours. Advantageously, each odd modes having a different number of nodes can be orthogonal to each of the other odd modes and can be orthogonal to all even modes.

Figure 13:
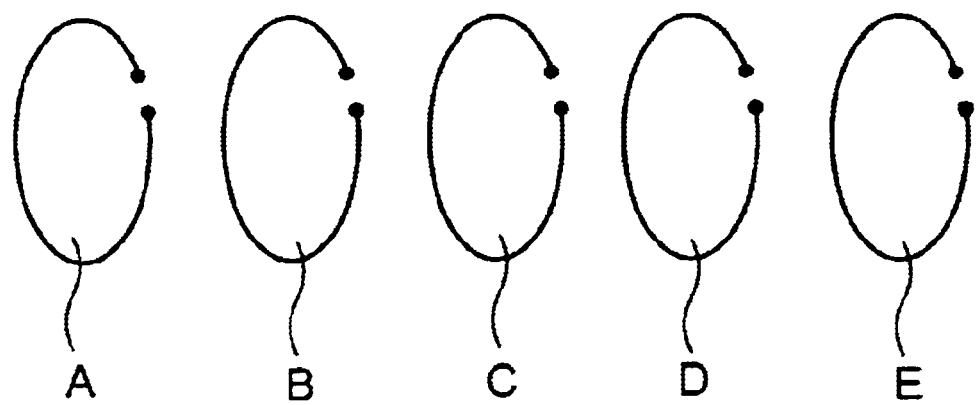
FIG. 13 illustrates an embodiment of the subject invention utilizing five loops.
Figure 14A:
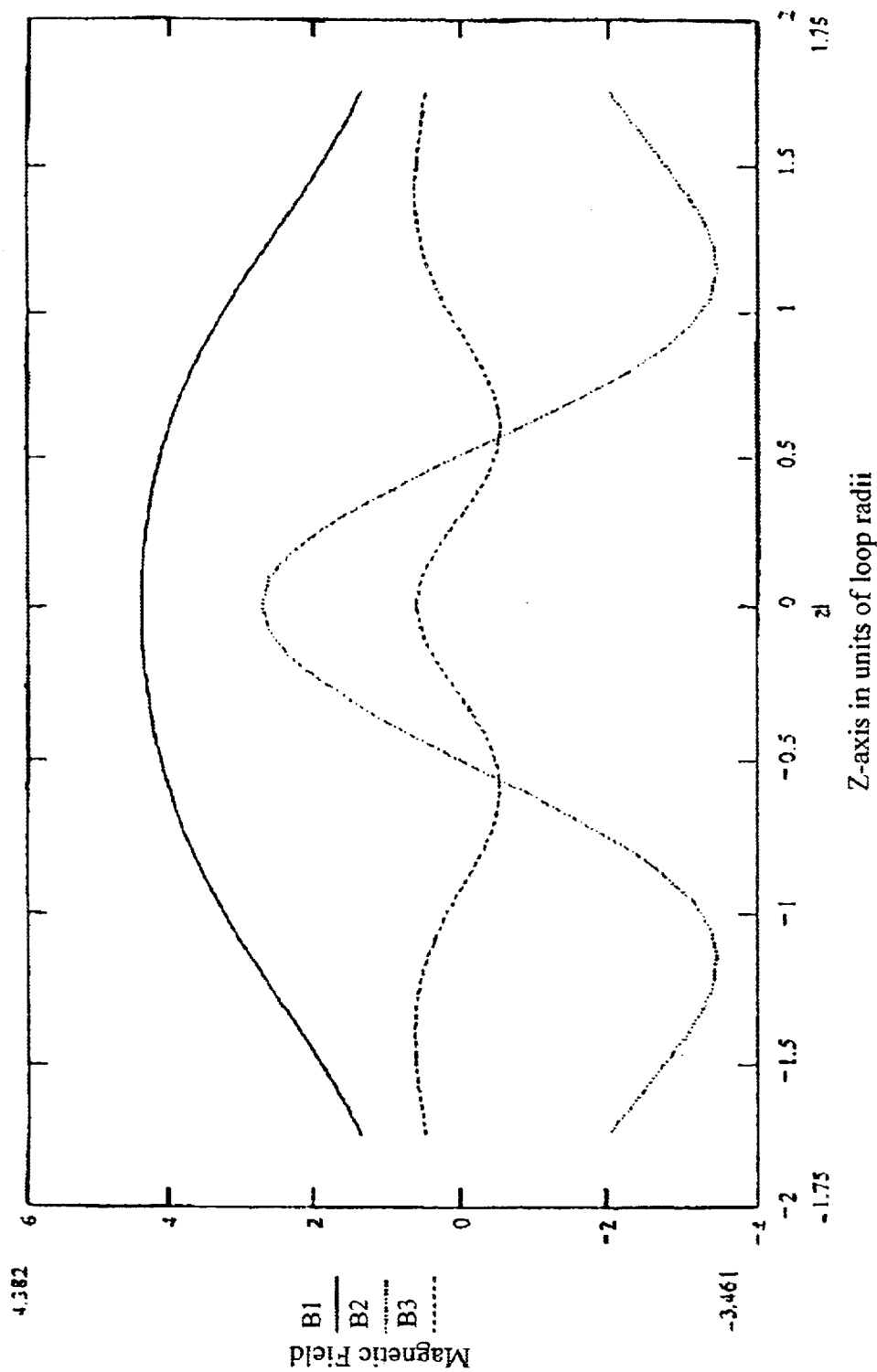
FIG. 14A illustrates example even symmetry field patterns down the central axis produced by various drive currents for the loop configuration shown in FIG. 13.
Figure 14B:
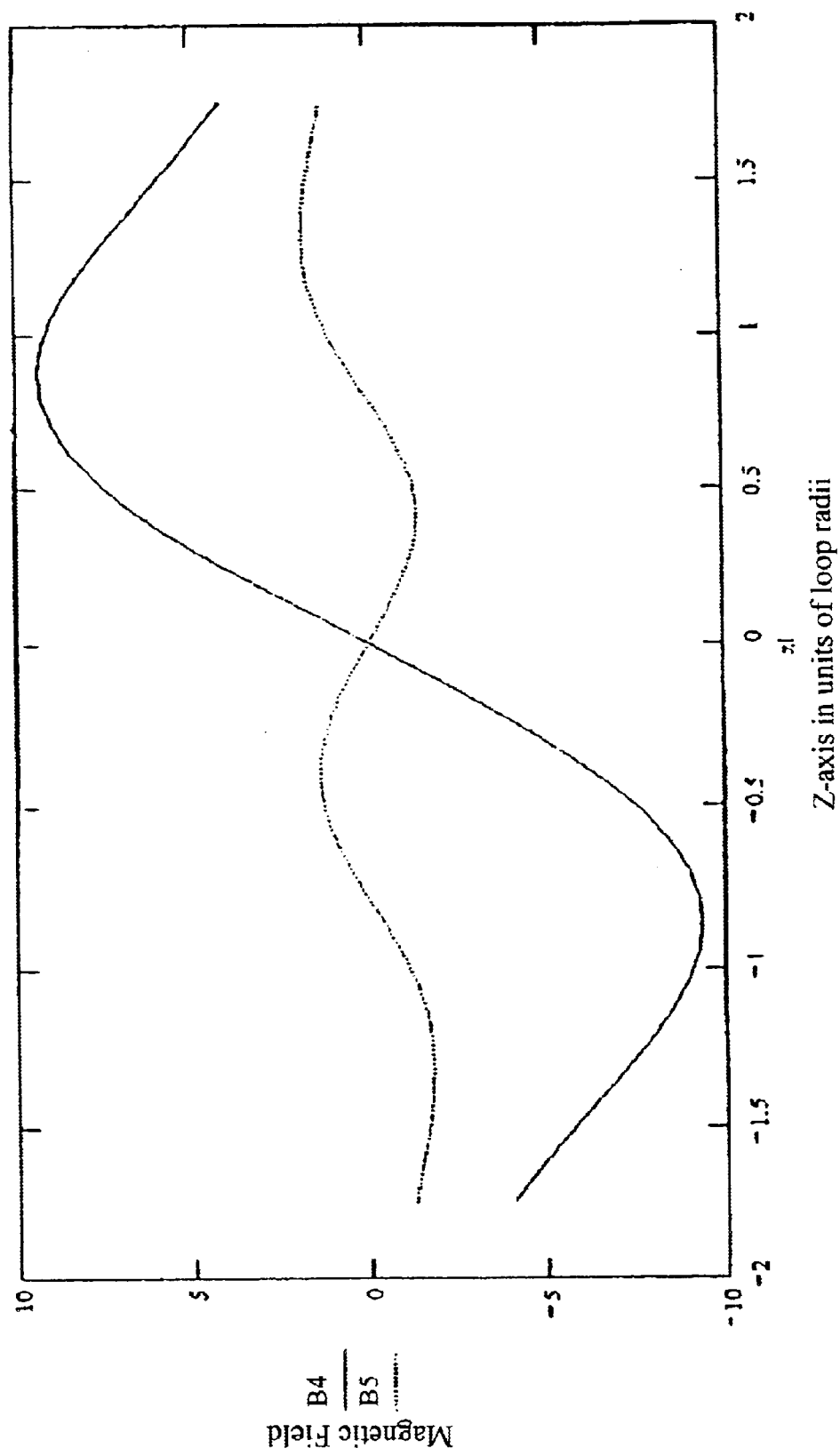
FIG. 14B illustrates example odd symmetry field patterns down the central axis produced by various drive currents for the loop configuration shown in FIG. 13.

Referring to FIG. 13, five loops oriented coaxially to one another, with bilateral symmetry around the center loop A, B, C, D, and E, are shown. Bilateral symmetry means any loop on one side of the center loop is the same distance to the center loop as a similar loop on the other side of the center loop. These five coaxial loops can be used to produce five current patterns that have negligible mutual inductance between each pair of patterns in a region of interest. Three of these current patterns have even symmetry, while two have odd symmetry around the center loop. The odd symmetry patterns are required to have zero current in the center loop, since odd symmetry of currents means that a loop on one side of center has opposite rotating current to the similar loop on the other side of center. Even symmetry of current requires a loop on one side of center to have equal current in the same direction to a similar loop on the other side of center. All even symmetry patterns will inherently have zero mutual inductance with all odd symmetry patterns. FIGS. 14A and 14B show example field patterns down the central axis of the loops which can produced by certain current combinations for the loop configuration shown in FIG. 13. The field patterns shown in FIGS. 14A and 14B illustrate how negligible mutual inductance can be produced between various field patterns.

With respect to embodiments described having opposite-rotating currents in a coaxial coil pair where the coils lie in a plane and are approximately the same size, the zero-flux contour typically lies between the two coils. In addition, two additional zero-flux contours can be considered to lie at infinity in either direction. However, if the parameters of the coil pair configuration are adjusted, one of the zero-flux contours of infinity can be brought toward the coil pair such that it remains outside the coil pair but is close enough to the coil pair to be useful with respect to the subject invention. In this case, another coil configuration can be placed at such zero-flux contour outside the coil pair.

Various embodiments illustrated in the Figures utilize coils residing in a plane. The subject apparatus and method are also applicable to coils not residing in a plane, where the subject invention can take advantage of essentially zero-flux contours which do not necessarily lie in a plane. By locating a coil in the zero-flux contours produced by other coil configurations, an independent channel can be achieved.

Figure 16A:
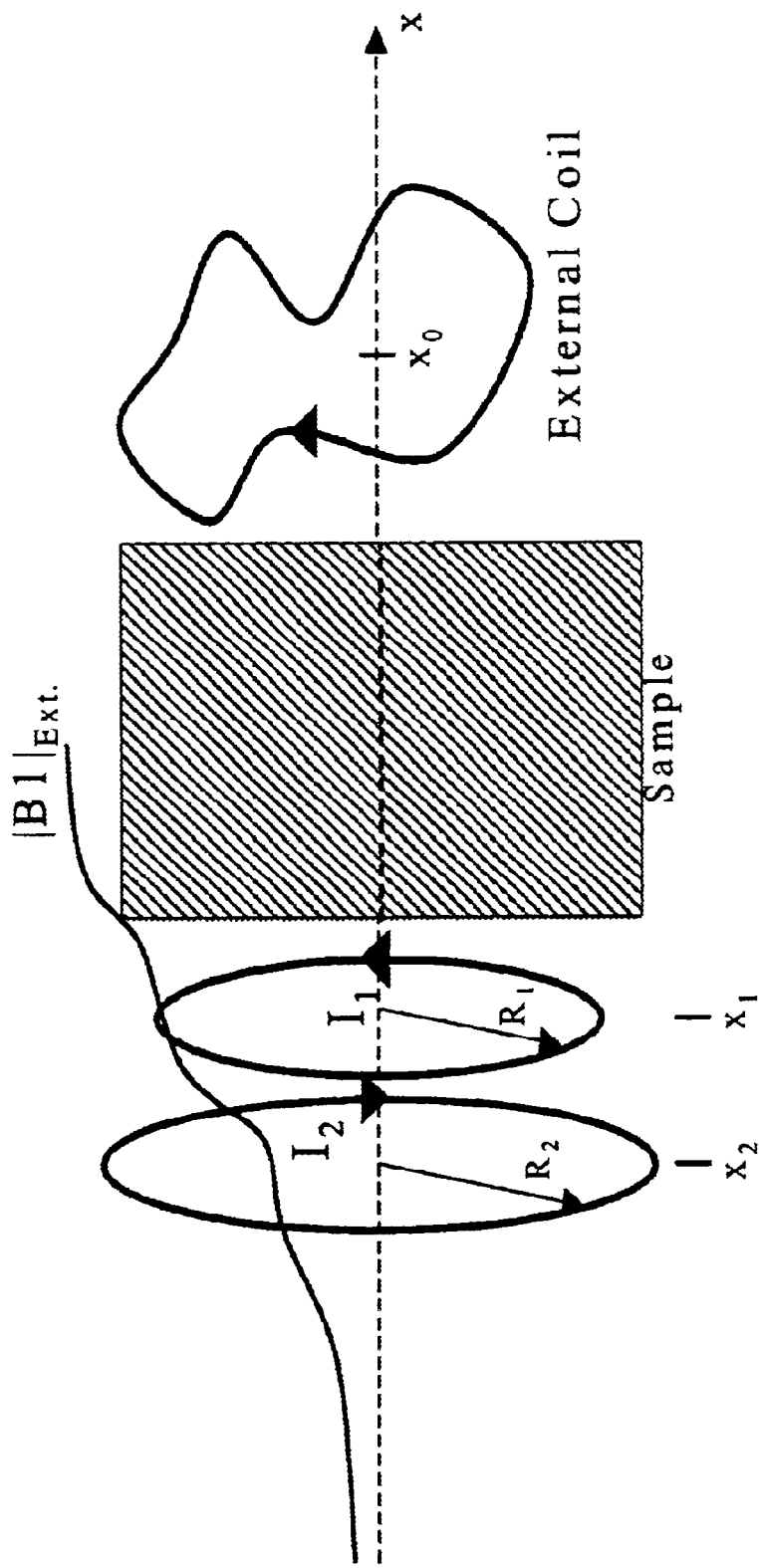
FIG. 16A illustrates a two-ring coil configuration such that the diameters, position, and relative currents in the rings are adjusted such that the EMF induced in ring #1 by $B1_{Ext}(x_1)$ is equal and opposite to the EMF induced in ring #2 by $B1_{Ext}(x_2)$, where $B1_{Ext}$ is produced by a current in an external coil.
Figure 16B:
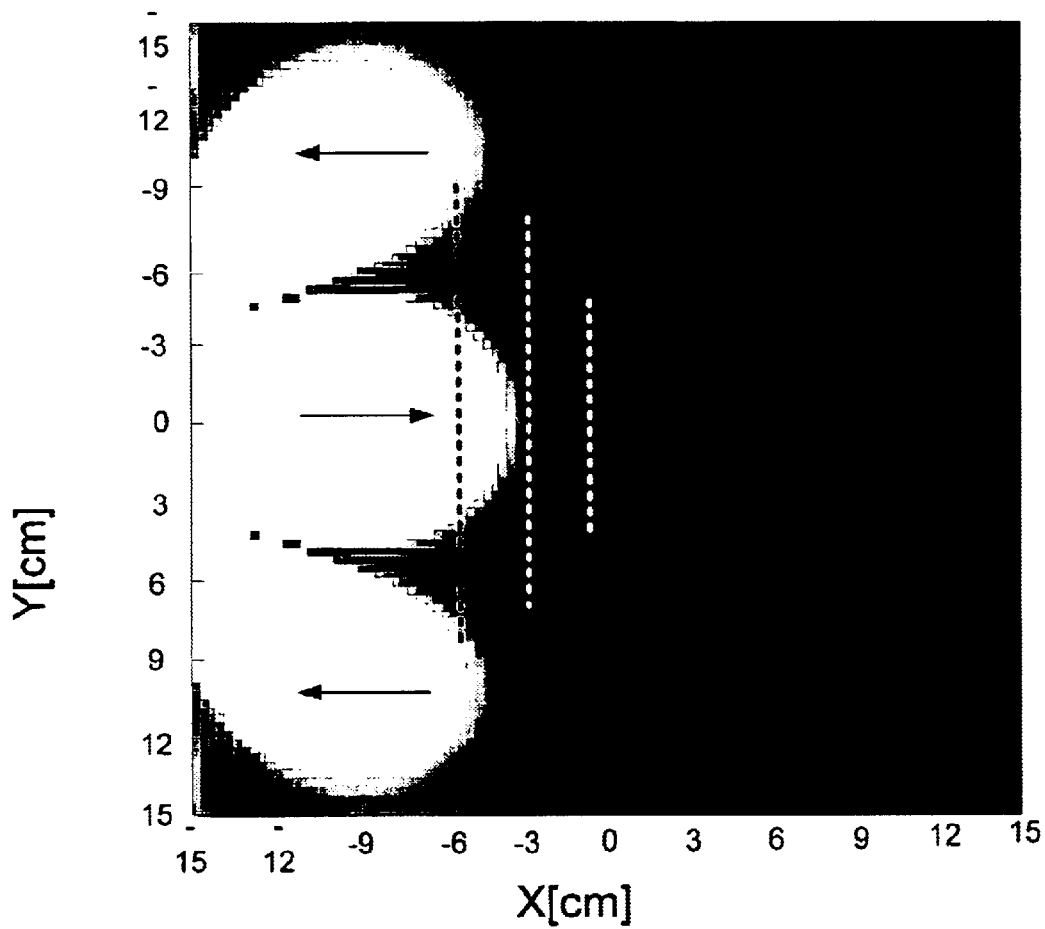
FIG. 16B shows a plot resulting from a Biot-Savart static calculation of the x-component $B_1$-field produced by the two-ring coil configuration shown in FIG. 16A in the X-Y plane (Z=0 cm), where the dashed lines represent three different external circular surface coils of different diameters and positions which have zero net flux (arrows indicate direction of $B_x$-field) and are therefore isolated from the two-ring coil configuration.

Referring to FIG. 16A, an external coil is shown at $X_0$ which can produce a non-uniform B-field at the position of a coil pair configuration, one coil at $X_1$ and a second coil at $X_2$. The coil at $X_1$ can have a radius $R_1$ and current $I_1$ while the coil at $X_2$ can have a radius $R_2$ and a current $I_2$. The coil pair can be adjusted such that the net electromagnetic force (EMF) caused by flux through the coils is zero, and, thus, net current is zero. In this way, the coil pair can be considered isolated from the external coil. By the principle of reciprocity, with such an arrangement, any B-field produced by the coil pair should produce a net B-flux through the external coil of zero as well. The coil pair can produce a B-field with a component that has a zero crossing in a plane through the external coil, as shown in FIG. 16B. In this way, both positive and negative contributions to the total B-flux exist which cancel upon integration over said plane. This is what is referred to as a zero-flux contour. One skilled in the art will recognize that this is equivalent to saying that the said coil and the external coil pair have zero mutual inductance.

As discussed, the subject invention can incorporate a plurality of coils such that a plurality of modes can be supported. For example, N loops with bilateral symmetry can support N-modes, corresponding to current patterns that all have zero net mutual inductive coupling to one another in a region of interest. The current patterns associated with these modes can be computed in a straight forward manner. As an example, the general case of N=5 loops, the matrix representing the inductive coupling from one mode to another can be written as:

| $L_1$ | $M_{12}$ | $M_{13}$ | $M_{14}$ | $M_{15}$ |
|---|---|---|---|---|
| $M_{21}$ | $L_2$ | $M_{23}$ | $M_{24}$ | $M_{25}$ |
| $M_{31}$ | $M_{32}$ | $L_3$ | $M_{34}$ | $M_{35}$ |
| $M_{41}$ | $M_{42}$ | $M_{43}$ | $L_4$ | $M_{45}$ |
| $M_{51}$ | $M_{52}$ | $M_{53}$ | $M_{54}$ | $L_5$ |

In general, $M_{ij}=M_{ji}$. For the special case of equivalent loops, the inductance (L) is identical for all loops. Additionally, $M_{12}=M_{45}$, $M_{23}=M_{34}$, $M_{14}=M_{25}$ and $M_{13}=M_{35}$ for a bilaterally symmetric arrangement of the five loops as shown, for example, in FIG. 13. Therefore the inductive coupling matrix can be written:

| L | $M_{12}$ | $M_{13}$ | $M_{14}$ | $M_{15}$ |
|---|---|---|---|---|
| $M_{12}$ | L | $M_{23}$ | $M_{24}$ | $M_{14}$ |
| $M_{13}$ | $M_{23}$ | L | $M_{23}$ | $M_{13}$ |
| $M_{14}$ | $M_{24}$ | $M_{23}$ | L | $M_{12}$ |
| $M_{15}$ | $M_{14}$ | $M_{13}$ | $M_{12}$ | L |

The eigenvectors of this matrix can be computed using ordinary means. The eigenvectors represent vectors of the form $$\begin{pmatrix} i_1 \\ i_2 \\ i_3 \\ i_4 \\ i_5 \end{pmatrix}.$$

The five sets of current patterns corresponding to the eigenvectors are orthogonal and therefore have zero effective mutual inductance. It can be shown that any symmetrical arrangement of N equivalent loops has a coupling matrix that has non-degenerate, orthogonal eigenvectors and thus N current patterns that are isolated from one another.

It should be understood that the examples and embodiments described herein are for illustrative purposes only and that various modifications or changes in light thereof will be suggested to persons skilled in the art and are to be included within the spirit and purview of this application.

What is claimed is:

1. A magnetic resonance imaging system coil configuration, comprising:

a radio frequency pair of coils in an opposite rotation orientation associated with a first magnetic field in a region of interest, wherein the region of interest is essentially within a cylinder created by the pair of coils;

a radio frequency single coil associated with a second magnetic field in the region of interest, wherein the first magnetic field and the second magnetic field are substantially parallel in the region of interest, wherein the single coil is positioned at an essentially zero-flux contour with respect to the first magnetic field.

2. The configuration according to claim 1, further comprising:

a means for utilizing the pair of coils for detecting the first magnetic field; and a means for utilizing the single coil for detecting the second magnetic field.

3. The configuration according to claim 1, further comprising:
a means for utilizing the pair of coils for generating the first magnetic field; and a means for utilizing the single coil for generating the second magnetic field.

4. The configuration according to claim 1, wherein the zero-flux contour is located outside the pair of coils with respect to the length of the cylinder created by the pair of coils.

5. The configuration according to clam 1,
wherein said pairs of coils are connected together by a pair of electrical conductors to form an Alderman-Grant coil pair.

6. The configuration according to claim 1, wherein each of said pair of coils and said single coil lie in planes parallel to each other, and wherein said essentially zero-flux contour is an essentially zero-flux plane.

7. The configuration according to claim 6, wherein the pair of coils and the single coil are co-axial.

8. The configuration according to claim 2,
wherein the single coil is a first channel and the pair of coils is a second channel such that coupling between the first channel and second channel is low.

9. The configuration according to claim 8, wherein coupling between the first channel and second channel is approximately zero.

10. The configuration according to claim 1, wherein the zero-flux contour is located between the pair of coils.

11. The configuration according to claim 10, wherein a second zero-flux contour with respect to the fit magnetic field is located outside the pair of coils, further comprising a second single coil for generating a third magnetic field in the region of interest, wherein the second single coil is positioned at the second zero-flux contour with respect to the first magnetic field.

12. The configuration according to claim 10,
wherein the single coil is positioned approximately equidistance from each of the pair of coils.

13. The configuration according to claim 10, wherein the single coil is positioned closer to one of the coils of the pair of coils than to the other.

14. The configuration according to claim 2, further comprising:
a means for utilizing the pair of coils for generating the first magnetic field; and
a means for utilizing the single coil for generating the second magnetic field.

15. The configuration according to claim 1, further comprising:
at least one Helmholtz coil pair associated with a third magnetic field essentially orthogonal to the frost and second magnetic fields in the region of interest.

16. The configuration according to claim 15, further comprising a means for utilizing said at least one Helmholtz coil pair for generating the third magnetic field.

17. The configuration according to claim 15, wherein said Helmholtz coil pair is of a configuration selected from the group consisting of: large loops, top/bottom loops, side by side loops, and a combination thereof.

18. The configuration according to claim 2, wherein said coils of said pair of coils and said single coil are selected from the group consisting of: a single turn loop, a multiturn solenoid wound as series loops, and a multiturn solenoid wound as parallel loops.

19. The configuration according to claim 1, further comprising:
a switching means for allowing the pair of coils and the single coil to operate in and switch between two or more of the modes in the group consisting of:
(i) the coils of the pair of coils and the single coil having currents rotating in the same direction;
(ii) the coils of the pair of coils having currents rotating in the same direction, with the single coil operating independently;
(iii) the coils of the pair of coils having currents rotating in opposite directions, with the single coil operating independently; and
(iv) the coils of the pair of coils having currents rotating in the same direction and the single coil having a current rotating in an opposite direction with respect to the currents of the pair of coils.

20. The configuration according to claim 1, further comprising:
at least one additional pair of coils, wherein said pair of coils in an opposite orientation has odd symmetry with respect to a plane,
wherein each of said at least one additional pair of coils is associated with a corresponding at least one additional magnetic field,
wherein each of said at least one additional pair of coils has even symmetry with respect to the plane and is associated with one of said at least one additional magnetic field such that said single coil is a first channel, said pair of coils in an opposite orientation is a second channel, and each of said at least one additional pair of coils is an additional channel which is orthogonal to the first channel, second channel, and each of the other additional channels.

21. The configuration according to claim 20, wherein each of said pair of coils, said single coil, and each of said at least additional pairs of coils lie in planes parallel to each other.

22. The configuration according to claim 21, wherein each of said pair of coils, said single coil, and each of said at least additional pairs of coils are coaxial.

23. The configuration according to claim 1, further comprising:
at least one additional pair of coils, wherein said pair of coils in an opposite orientation has odd symmetry with respect to a plane,
wherein each of said at least one additional pair of coils is associated with a corresponding at least one additional magnetic field,
wherein each of said at least one additional pair of coils has odds symmetry with respect to the plane and is associated with one of said at least one additional magnetic field such that said single coil is a first channel, said pair of coils in an opposite orientation is a second channel, and each of said at least one additional pair of coils is an additional channel which is orthogonal to the first channel, second channel, and each of the other additional channels.

24. The configuration according to claim 23, wherein each of said pair of coils, said single coil, and each of said at least additional pairs of coils lie in planes parallel to each other.

25. The configuration according to claim 24, wherein each of said pair of coils, said single coil, and each of said at least additional pairs of coils are coaxial.

26. The configuration according to claim 1, wherein the pair of coils and single coil are positioned with respect to an external static magnetic field such that the direction of the external static magnetic field is perpendicular to the axis of the cylinder created by the pair of coils.

27. A method of detecting magnetic fields in a magnetic resonance imaging system, comprising the following steps:
   detecting a first magnetic field in a region of interest utilizing a radio frequency pair of coils in an opposite rotation orientation associated with the first magnetic field in the region of interest, wherein the first magnetic field and the second magnetic field are substantially parallel in the region of interest, wherein the region of interest is essentially within a cylinder created by the pair of coils; and
   detecting a second magnetic field in the region of interest utilizing a radio frequency single coil associated with a second magnetic field in the region of interest, wherein the single coil is positioned at an essentially zero-flux contour with respect to the first magnetic field.

28. A magnetic resonance imaging system RF coil configuration, comprising:
   at least five RF coils with bilateral symmetry, wherein the at least five RF coils are coaxial,
   wherein said at least five RF coils are associated with a plurality of modes such that the number of modes is less than or equal to the number of RF coils, wherein said plurality of modes correspond with a plurality of current patterns, each of said plurality of current patterns having zero net mutual inductive coupling to each of the other of said plurality of current patterns in a region of interest.

29. The configuration according to claim 28, further comprising:
   a means for utilizing the plurality of RF coils for detecting magnetic fields associated with the plurality of current patterns.

30. The configuration according to claim 28, further comprising:
   a means for utilizing the plurality of RF coils for generating magnetic fields associates with the plurality of current patterns.

31. A method of detecting magnetic fields in a magnetic resonance imaging system, comprising the flooring steps:
   positioning at least five RF coils coaxially with respect to a region of interest such that the at least five RF coils support a plurality of modes corresponding to a plurality of current patterns; and
   detecting the plurality of modes associated with the at least five RF coils, wherein the number of RF coils is greater than or equal to the number of modes, and wherein each of the plurality of current patterns has zero net mutual inductive coupling to each of the other of the plurality of current pattern in a region of interest.

32. A method of detecting magnetic fields in a magnetic resonance imaging system, comprising:
   positioning a radio frequency pair of coils in an opposite rotation orientation, wherein the pair of coils are associated with a first magnetic field in a region of interest, wherein the region of interest is essentially within a cylinder created by the pair of coils;
   positioning a radio frequency single coil at an essentially zero-flux contour with respect to the first magnetic field, wherein the single coil is associated with a second magnetic field in the region of interest;
   detecting the first magnetic field with the pair of coils; and
   detecting the second magnetic field with the single coil.

33. The method according to claim 32, wherein the zero-flux contour is located outside the pair of coils, wherein the region of interest extends outside the pair of coils.

34. The method according to claim 32, further comprising:
   positioning an object to be imaged in the region of interest.

35. The method according to claim 32, wherein positioning an object to be imaged in the region of interest comprises positioning an object to be imaged such that at least a portion of the object is in the essentially zero-flux contour with respect to the first magnetic field.

36. The method according to claim 35, wherein each of said pair of coils and said single coil lie in planes parallel to each other, and wherein said essentially zero-flux contour is an essentially zero-flux plane, wherein positioning an object to be imaged in the region of interest comprises positioning an object to be imaged such that at least a portion of the object is in the essentially zero-flux plane.

37. The method according to claim 34, wherein positioning an object to be imaged in the region of interest comprises inserting at least a portion of the object to be imaged into the region of interest through one of the pair of coils.

38. The method according to claim 37, wherein positioning an object to be imaged in the region of interest further comprises inserting at least a portion of the at least a portion of the object to be imaged through the single coil.

39. The method according to claim 32, further comprising generating the first magnetic field with the pair of coils, and generating the second magnetic field with the single coil.

40. The method according to claim 32, wherein the single coil is a first channel and the pair of coils is a second channel such that coupling between the first channel and second channel is low.

41. The method according to claim 40, wherein coupling between the first channel and second channel is approximately zero.

42. The method according to claim 32, further comprising positioning the pair of coils with respect to an external static magnetic field such that the direction of the external static magnetic field is perpendicular to the axis of the cylinder created by the pair of coils.

43. The method according to claim 42, wherein positioning the pair of coils with respect to an external static magnetic field comprises positioning the pair of coils with respect to a vertical external static magnetic field.

44. A method of coil configuration for a magnetic resonance imaging system, comprising:
   positioning at least five RF coils with bilateral symmetry, wherein the at least five RF coils are coaxial, wherein said at least five RF coils are associated with a plurality of modes such that the number of modes is less than or equal to the number of RF coils, wherein said plurality of modes correspond with a plurality of current patterns, each of said plurality of current patterns having zero net mutual inductive coupling to each of the other of said plurality of current patterns in a region of interest; and
   detecting magnetic fields associated with the plurality of modes with the at least five RF coils.

45. The method according to claim 37, further comprising:
   positioning at least one additional pair of coils, wherein said pair of coils in an opposite orientation has odd symmetry with respect to a plane, wherein each of said at least one additional pair of coils is associated with a corresponding at least one additional magnetic field;

and detecting the corresponding at least one additional magnetic field with the corresponding at least one additional pair of coils, wherein each of said at least one additional pair of coils has odd symmetry with respect to the plane and is associated with one of said at least one additional magnetic field such that said single coil is a first channel, said pair of coils in an opposite orientation is a second cell, and each of said at least one additional pair of coils is an additional channel which is orthogonal to the first channel, second channel, and each of the other additional channels.

46. The method according to claim 45, wherein each of said pair of coils, said single coil, and each of said at least additional pairs of coils lie in planes parallel to each other.

47. The method according to claim 46, wherein each of said pair of coils, said single coil, and each of said at least additional pairs of coils are coaxial.

48. The method according to claim 32, wherein the zero-flux contour is located between the pair of coils.

49. The method according to claim 33, wherein a second zero-flux contour with respect to the first magnetic field is located outside the pair of coils, further comprising a second single coil for generating a third magnetic field in the region of interest, wherein the second single coil is positioned at the second zero-flux contour with respect to the first magnetic field.

50. The method according to claim 48,
wherein the single coil is positioned approximately equidistance from each of the pair of coils.

51. The method according to claim 48, wherein the single coil is positioned closer to one of the coils of the pair of coils than to the other.

52. The method according to claim 32, further comprising:
positioning at least one Helmholtz coil pair, wherein the at least one Helmholtz coil pair is associated with a third magnetic field essentially orthogonal to the first and second magnetic fields in the region of interest; and detecting the third magnet field with the at least one Helmholtz coil pair.

53. The method according to claim 52, further comprising utilizing said at least one Helmholtz coil pair for generating the third magnetic field.

54. The method according to claim 52, wherein said Helmholtz coil pair is of a configuration selected from the group consisting of: large loops, top/bottom loops, side by side loops, and a combination thereof.

55. The method according to claim 32,
wherein said pairs of coils are connected together by a pair of electrical conductors to form an Alderman-Grant coil pair.

56. The method according to claim 32, further comprising:
providing a switching means for allowing the pair of coils and the single coil to operate in and switch between two or more of the modes in the group consisting of:
(i) the coils of the pair of coils and the single coil having currents rotating in the same direction;
(ii) the coils of the pair of coils having currents rotating in the same direction, with the single coil operating independently;
(iii) the coils of the pair of coils having current rotating in opposite directions, with the single coil operating independently; and
(iv) the coils of the pair of coils having currents rotating in the same direction and the single coil having a current rotating in an opposite direction with respect to the currents of the pair of coils.

57. The method according to claim 32, further comprising:
positioning at least one additional pair of coils, wherein said pair of coils in an opposite orientation has odd symmetry with respect to a plane, wherein each of said at least one additional pair of coils is associated with a corresponding at least one additional magnetic field; and detecting the corresponding at least one additional magnetic field with the corresponding at least one additional pair of coils,
wherein each of said at least one additional pair of coils has even symmetry with respect to the plane and is associated with one of said at least one additional magnetic field such that said single coil is a first channel, said pair of coils in an opposite orientation is a second channel, and each of said at least one additional pair of coils is an additional channel which is orthogonal to the first channel, second channel, and each of the other additional channels.

58. The method according to claim 57, wherein each of said pair of coils, said single coil, and each of said at least additional pairs of coils lie in planes parallel to each other.

59. The method according to claim 58, wherein each of said pair of coils, said single coil, and each of said at least additional pairs of coils are coaxial.

* * * * *

UNITED STATES PATENT AND TRADEMARK OFFICE
CERTIFICATE OF CORRECTION

PATENT NO. : 6,836,118 B2
DATED : December 28, 2004
INVENTOR(S) : David A. Molyneaux et al.

It is certified that error appears in the above-identified patent and that said Letters Patent is hereby corrected as shown below:

Column 6,
Line 29, "FIGS. 12, 10A and 10A'" should read -- Figure 12, 10A and --.
Line 33, "of FIGS. 9A" should read -- of Figure 9A; --.
Line 35, "15B of FIGS. 9A" should read -- 15B of Figure 9A --.

Column 7,
Line 57, "Referring to FIGS. 10" should read -- Referring to Figure 10 --.

Column 8,
Line 11, "FIGS. 11," should read -- Figure 11 --.

Column 11,
Line 32, "the fit magnetic" should read -- the first magnetic field --.
Line 54, "the frost and" should read -- the first and --.

Column 12,
Line 52, "has odds symmetry" should read -- has odd symmetry --.

Column 13,
Line 9, "in the region" should read -- in a region --.
Line 40, "associates with" should read -- associated with --.
Line 43, "flooring steps:" should read -- following steps: --.

Column 15,
Line 9, "a second cell," should read -- a second channel --.

UNITED STATES PATENT AND TRADEMARK OFFICE
CERTIFICATE OF CORRECTION

PATENT NO.    : 6,836,118 B2
DATED         : December 28, 2004
INVENTOR(S)   : David A. Molyneaux et al.

It is certified that error appears in the above-identified patent and that said Letters Patent is hereby corrected as shown below:

Column 16,
Line 15, "having current" should read -- having currents --.

Signed and Sealed this

Sixteenth Day of August, 2005

JON W. DUDAS
*Director of the United States Patent and Trademark Office*